(12) United States Patent
Hill et al.

(10) Patent No.: US 11,543,757 B2
(45) Date of Patent: Jan. 3, 2023

(54) SYSTEM AND METHOD FOR OPTICAL-PATH COUPLING OF LIGHT FOR IN-SITU PHOTOCHEMICAL CLEANING IN PROJECTION IMAGING SYSTEMS

(71) Applicant: KLA Corporation, Milpitas, CA (US)

(72) Inventors: Shannon Hill, Milpitas, CA (US); Gildardo Delgado, Livermore, CA (US)

(73) Assignee: KLA Corporation, Milpitas, CA (US)

( * ) Notice: Subject to any disclaimer, the term of this patent is extended or adjusted under 35 U.S.C. 154(b) by 0 days.

(21) Appl. No.: 17/235,573

(22) Filed: Apr. 20, 2021

(65) Prior Publication Data

US 2022/0334504 A1 Oct. 20, 2022

(51) Int. Cl.
*G03F 7/20* (2006.01)

(52) U.S. Cl.
CPC ...... *G03F 7/70925* (2013.01); *G03F 7/70025* (2013.01); *G03F 7/7085* (2013.01); *G03F 7/70916* (2013.01); *G03F 7/70933* (2013.01)

(58) Field of Classification Search
CPC .......... G03F 1/84; G03F 1/82; G03F 7/70933; G03F 7/70925; G03F 7/7085; G01N 2021/95676
See application file for complete search history.

(56) References Cited

U.S. PATENT DOCUMENTS

| | | | |
|---|---|---|---|
| 8,711,346 B2 | 4/2014 | Stokowski | |
| 8,785,082 B2 | 7/2014 | Xiong et al. | |
| 8,916,831 B2 | 12/2014 | Wang | |
| 9,335,279 B2 | 5/2016 | Delgado | |
| 9,810,991 B2 | 11/2017 | Chilese et al. | |
| 10,232,413 B2 | 3/2019 | Dea et al. | |
| 10,953,441 B2 | 3/2021 | Delgado et al. | |
| 2006/0000489 A1 | 1/2006 | Chan et al. | |
| 2011/0262866 A1* | 10/2011 | Nakayama | G03F 7/70925 430/311 |
| 2011/0279799 A1* | 11/2011 | Singer | G03F 7/70925 355/53 |
| 2012/0223256 A1 | 9/2012 | Pykanov et al. | |
| 2012/0298134 A1 | 11/2012 | Moriya et al. | |
| 2013/0322076 A1 | 12/2013 | Parker et al. | |

(Continued)

FOREIGN PATENT DOCUMENTS

JP 2006093477 A 4/2006

OTHER PUBLICATIONS

International Search Report and Written Opinion in International Application No. PCT/US2022/025454 dated Aug. 5, 2022, 8 pages.

*Primary Examiner* — Steven Whitesell Gordon
(74) *Attorney, Agent, or Firm* — Suiter Swantz pc llo (57) ABSTRACT

Systems for cleaning optical surfaces of overlay inspection systems are disclosed. In particular, systems for optical-path coupling of light for in-situ photochemical cleaning in projection imaging systems are disclosed. A system for cleaning optical surfaces of overlay inspection systems includes a first illumination source, a detector, a set of illumination optics, and a set of imaging optics. In some embodiments, the system may include at least one of a second illumination source and a third illumination source, each of which may be configured to cause or aid the removal of contaminants from one or more optical surfaces of the system.

40 Claims, 5 Drawing Sheets

(56) References Cited

U.S. PATENT DOCUMENTS

| | | | |
|---|---|---|---|
| 2014/0374619 A1* | 12/2014 | Klebanoff | B08B 7/0057 |
| | | | 250/431 |
| 2017/0235031 A1* | 8/2017 | Takehisa | G02B 5/0891 |
| | | | 359/566 |
| 2018/0021818 A1 | 1/2018 | VanHoomissen et al. | |
| 2020/0384509 A1 | 12/2020 | Azaria et al. | |

* cited by examiner

SYSTEM AND METHOD FOR OPTICAL-PATH COUPLING OF LIGHT FOR IN-SITU PHOTOCHEMICAL CLEANING IN PROJECTION IMAGING SYSTEMS

TECHNICAL FIELD

The present disclosure generally relates to the field of inspection systems, including those inspection systems having extreme ultraviolet optical systems and, more particularly, to cleaning optical elements of inspection systems.

BACKGROUND

As the demand for lithography-based device structures having ever-smaller features continues to increase, the need for improved illumination sources used for lithography and inspection of the associated reticles that lithographically print these ever-shrinking devices continues to grow. Certain such illumination sources, utilized in lithography and inspection systems, are inspection systems that utilize extreme ultraviolet (EUV), vacuum ultraviolet (VUV) light, deep ultraviolet light (DUV), or ultraviolet (UV) light.

In many cases, inspection systems, and especially their optics, need to operate in a clean, vacuum environment. However, contaminants that tend to foul the vacuum environment cannot be completely removed from the system. Such is the case, for example, when components of the inspection system, such as certain optical surfaces, contain unavoidable contaminants. As a result, the optics of the inspection system (in many cases located within a vacuum chamber), are exposed to a partial pressure of contaminants, such as hydrocarbons and gas phase $H_2O$. These contaminants, when exposed to the radiation within the system (e.g., as may be the case during an illumination process), will lead to the growth of carbon and/or oxides optical surfaces of the system, such as mirrors. In the case of mirrors, the contamination will cause a reflectivity drop, resulting in a phase change in the light incident upon a given mirror. Both of these effects, if unchecked, will cause a degradation of the optics over time, leading to a failure of the optical system.

Therefore, it is desirable to provide a method and system that cure the defects of the prior art identified above.

SUMMARY

An optical system is disclosed, in accordance with one or more embodiments of the present disclosure. An optical system may include a first illumination source configured to generate light. In another embodiment, an optical system may include a detector. In another embodiment, an optical system may include a set of illumination optics configured to receive at least a portion of the light from the first illumination source and direct at least a portion of the light to one or more sample surfaces of one or more samples along an illumination axis. In another embodiment, an optical system may include a set of imaging optics configured to receive at least a portion of the light from the one or more sample surfaces and direct the at least a portion of the light from the one or more sample surfaces to the detector along an imaging axis. In another embodiment, an optical system may include a second illumination source configured to generate a first cleaning beam and direct at least a portion of the first cleaning beam to the set of illumination optics via at least one of the illumination axis or the imaging axis. In another embodiment, an optical system may include a third illumination source configured to generate a second cleaning beam and direct at least a portion of the second cleaning beam to at least one of the set of imaging optics or the detector via at least one of the illumination axis or the imaging axis. In another embodiment, the optical system may include one or more chambers, wherein the set of illumination optics, the set of imaging optics, and the detector are disposed within the one or more chambers, wherein each of the one or more chambers is configured to contain a selected purge gas, wherein the selected purge gas is photoreactive with at least one of the first cleaning beam or the second cleaning beam, and wherein photoreaction of the selected purge gas with at least one of the first cleaning beam or the second cleaning beam forms at least one of one or more ionic species or one or more free-radical species, and wherein the at least one of one or more ionic species or one or more free-radical species is capable of converting to one or more volatile species contaminants from one or more optical surfaces of at least one of the set of illumination optics, the set of imaging optics, or the detector.

An optical system is disclosed, in accordance with one or more embodiments of the present disclosure. An optical system may include a first illumination source configured to generate light. In another embodiment, the optical system may include a detector. In another embodiment, the optical system may include a set of illumination optics configured to receive at least a portion of the light from the first illumination source and direct at least a portion of the light to one or more sample surfaces of one or more samples along an illumination axis. In another embodiment, the optical system may include a set of imaging optics configured to receive at least a portion of the light from the one or more sample surfaces and direct the at least a portion of the light from the one or more sample surfaces to the detector along an imaging axis. In another embodiment, the optical system may include a second illumination source configured to generate a first cleaning beam and direct at least a portion of the first cleaning beam to the set of illumination optics via at least one of the illumination axis or the imaging axis. In another embodiment, the optical system may include one or more chambers, wherein the set of illumination optics, the set of imaging optics, and the detector are disposed within the one or more chambers, wherein each of the one or more chambers is configured to contain a selected purge gas, wherein the selected purge gas is photoreactive with the first cleaning beam, and wherein photoreaction of the selected purge gas with the first cleaning beam forms at least one of one or more ionic species or one or more free-radical species, and wherein the at least one of one or more ionic species or one or more free-radical species is capable of converting to one or more volatile species contaminants from one or more optical surfaces of at least one of the set of illumination optics, the set of imaging optics, or the detector.

A method of cleaning optical surfaces is disclosed, in accordance with one or more embodiments of the present disclosure. In one embodiment, the method includes providing a selected purge gas to one or more chambers. In another embodiment, the method includes directing one or more cleaning beams to one or more optical surfaces within the one or more chambers, wherein each of the one or more cleaning beams is photoreactive with the selected purge gas, and wherein photoreaction of the selected purge gas with the one or more cleaning beams forms at least one of one or more ionic species or one or more free-radical species, and wherein the at least one of one or more ionic species or one or more free-radical species is capable of converting, to one or more volatile species, contaminants from one or more optical surfaces to form a gaseous reaction product. In another embodiment, the method includes evacuating the gaseous reaction product from the one or more chambers.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures.

DETAILED DESCRIPTION

The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure. Reference will now be made in detail to the subject matter disclosed, which is illustrated in the accompanying drawings.

Embodiments of the present disclosure are directed to systems and methods for cleaning optical surfaces of overlay inspection systems. In particular, systems and methods for optical-path coupling of light for in-situ photochemical cleaning in projection imaging systems are disclosed.

It is recognized herein that contamination of optical surfaces within an inspection system may occur when volatile organic contaminant species adsorb on the optical surfaces such that they may interact with energetic radiation (e.g., EUV light or VUV light) to produce a carbonaceous buildup in the areas exposed to the energetic radiation. The presence of a tiny amount of buildup (e.g., buildup having a height of only a few nanometers) may cause significant degradations in the performance of the optical elements of the inspection system.

Contaminant buildups on optical surfaces of an inspection system may be removed by one or more photochemical reactions. For example, deposited carbonaceous buildups may be removed via one or more reactions with an ionic or free-radical species (e.g., oxygen (1D) and other excited states of oxygen, as well as excited states of nitrogen, fluorine, or the like). The ionic or free-radical species may be generated when a precursor gas (e.g., ozone) reacts with a photon of sufficient energy (e.g., a EUV, VUV, DUV, or UV photon). In this way, irradiation of an optical surface with illumination of sufficient energy in the presence of a precursor gas may cause the removal of contaminants built up on the optical surface.

Figure 1A:
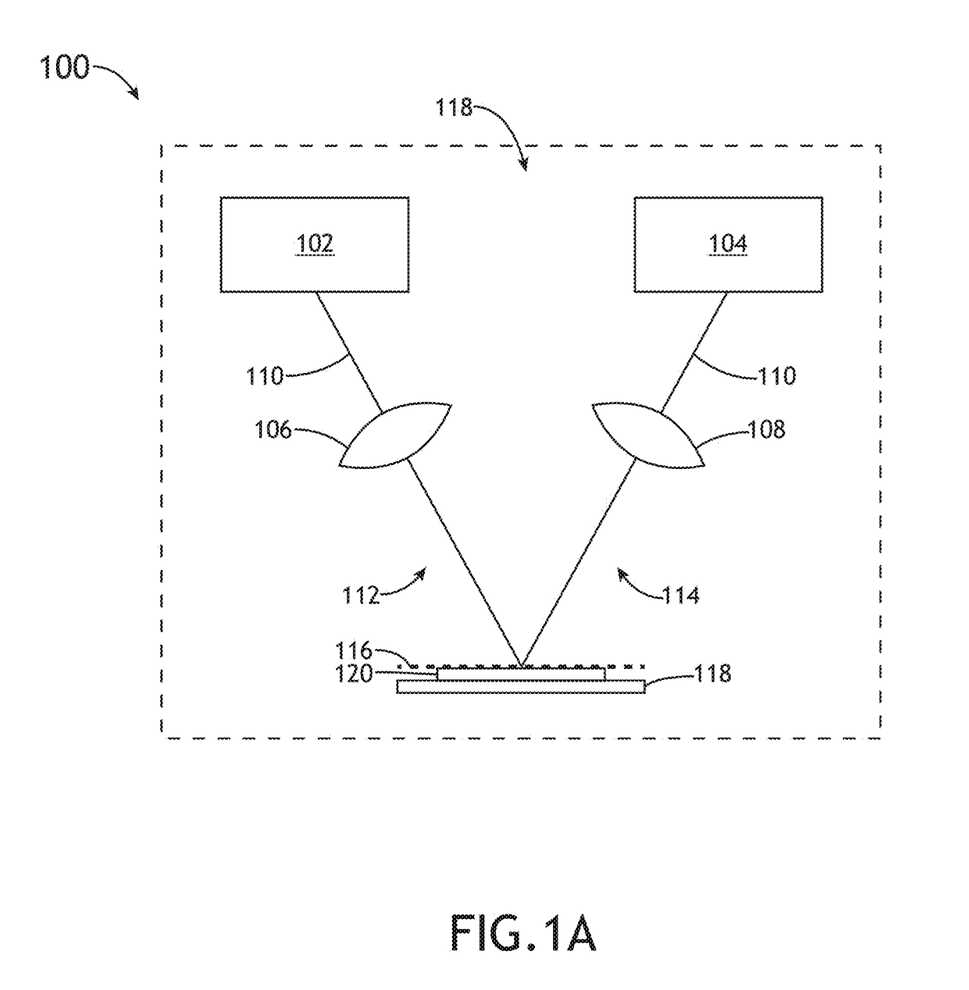
FIG. 1A illustrates a conceptual view of an optical system, in accordance with one or more embodiments of the present disclosure.
Figure 1B:
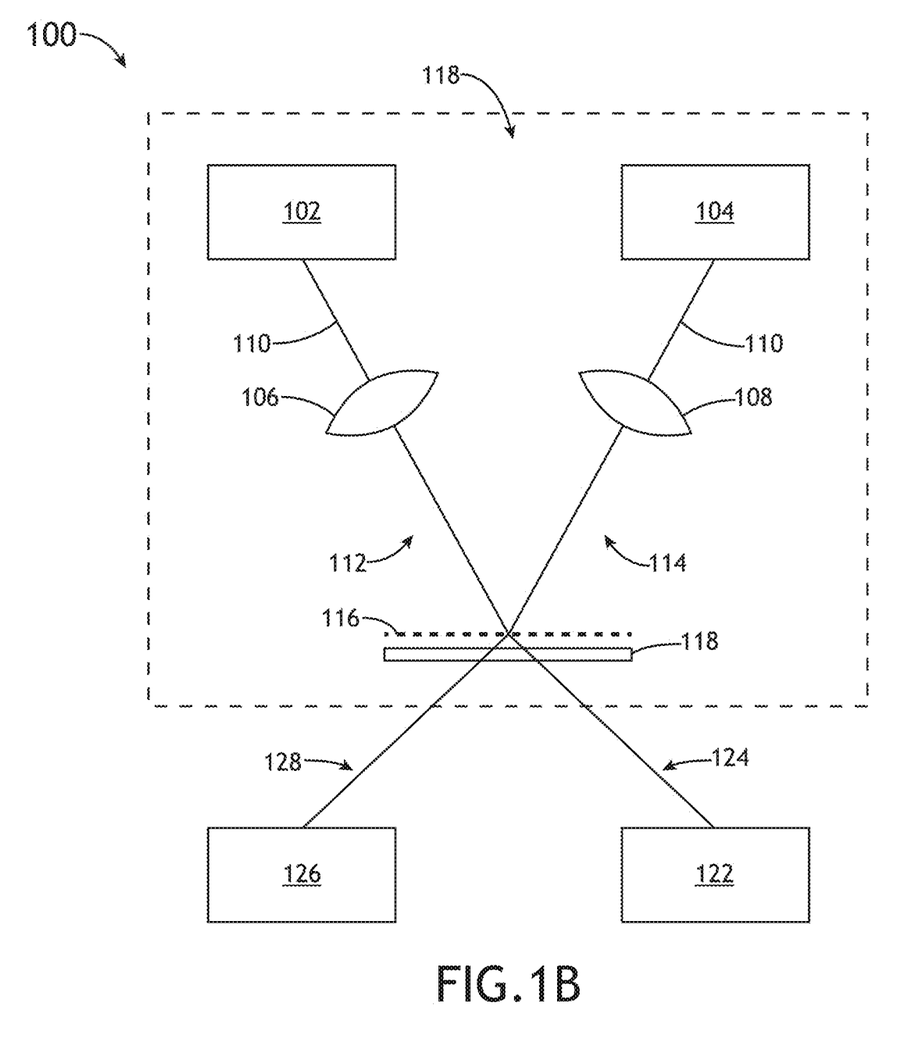
FIG. 1B illustrates a conceptual view of an optical system, in accordance with one or more embodiments of the present disclosure.
Figure 1C:
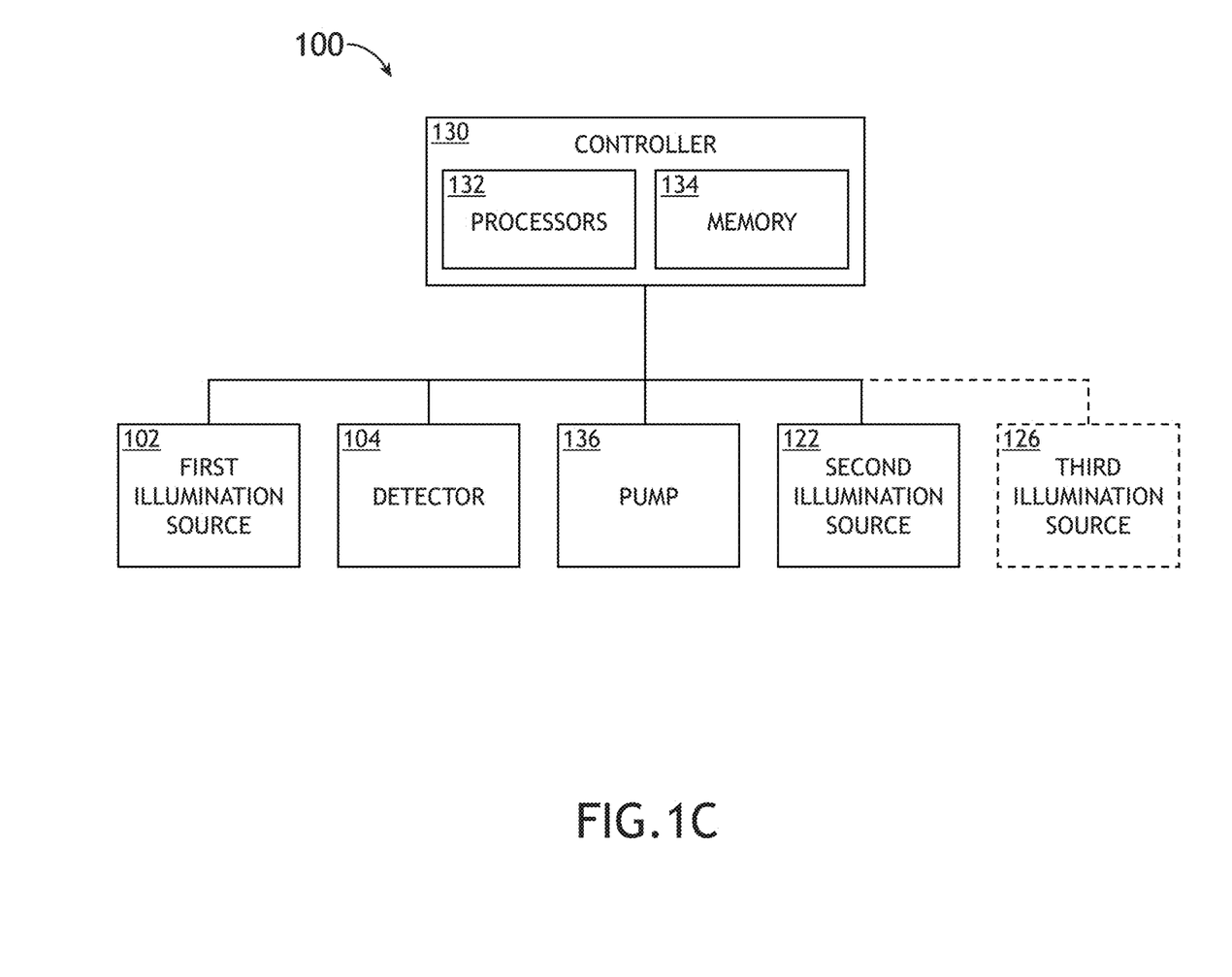
FIG. 1C illustrates a block diagram view of an optical system, in accordance with one or more embodiments of the present disclosure.

FIGS. 1A through 1C generally illustrate embodiments of an optical system 100, in accordance with one or more embodiments of the present disclosure. FIG. 1A illustrates a conceptual view of an optical system 100, in accordance with one or more embodiments of the present disclosure.

In one embodiment, the system 100 includes a first illumination source 102 configured to generate light 110. In another embodiment, the system 100 includes a set of illumination optics 106 configured to direct at least a portion of the light to one or more sample surfaces 116 of one or more samples 120. For example, the first illumination source 102 may include, but is not limited to, a broadband light source (e.g., a light source suitable for generating EUV, VUV, DUV, and/or UV light), or a narrowband illumination source (e.g., a laser source). The first illumination source 102 may include a laser source configured to generate illumination having a wavelength of at least one of approximately 355 nanometers, approximately 266 nanometers, or approximately 193 nanometers.

In one embodiment, the illumination optics 106 may be configured to direct illumination 110 emanating from the first illumination source 102 to the one or more samples 120 disposed on a stage 118 along an illumination axis 112 (e.g., an illumination pathway). The one or more samples 120 may include, but are not limited to, a wafer (e.g., semiconductor wafer) or a reticle.

In another embodiment, the system 100 may include set of imaging elements 108 configured to receive illumination from the surface of the one or more samples 120 and direct the illumination from the one or more samples 120 to a detector 104 via an imaging axis 114 (e.g., an illumination collection pathway). For example, the imaging optics 108 may include one or more projection optics suitable for collecting light scattered, reflected, diffracted or otherwise emanating from the sample 120 and directing the light to one or more detectors 104 (e.g., CCD, TDI-CCD, PMT and the like). In another embodiment, the system 100 includes a controller (as shown in FIG. 1C) for receiving and/or analyzing signals indicative of illumination collected from the sample 120 via the imaging optics 108 and the detector 104.

It is noted that, as illustrated by FIG. 1A, embodiments of the present disclosure may be configured to perform one or more inspection processes and one or more cleaning processes. For example, as shown in FIG. 1A, the optical system 100 may be configured to perform one or more inspection processes of the sample 120. By way of another example, as shown in FIG. 1B, the optical system 100 may be configured to perform one or more cleaning processes with respect to one or more optical surfaces of the optical system 100.

FIG. 1B illustrates an embodiment of the optical system 100 configured to perform one or more cleaning processes.

In some embodiments, the optical system 100 may include a second illumination source 122 configured to generate a first cleaning beam 124. The second illumination source 122 may include, but is not limited to, any illumination source configured to generate EUV, VUV, DUV, and/or UV light. In this regard, the first cleaning beam 124 may include, but is not limited to, a EUV, VUV, DUV, and/or UV beam.

The second illumination source 122 may be configured to direct the first cleaning beam 124 to the illumination optics 106. For example, though not shown, the second illumination source 122 may be configured to direct the first cleaning beam 124 to one or more optical surfaces of the illumination optics 106 via one or more first cleaning optical elements. The second illumination source 122 (and, in some embodiments, one or more first cleaning optical elements) may be configured to direct the first cleaning beam 124 to a point in space corresponding to a mask surface 116. For example, as shown in FIG. 1B, when configured for cleaning, the optical system 100 may not include a sample 120. However, the second illumination source 122 (and, as applicable, one or more first cleaning optical elements) may configured to direct the first cleaning beam 124 to that point within the system 100 to which the illumination optics 106 may be configured to direct the light 110. In this sense, the first cleaning beam 124 may be configured to propagate along the illumination axis 112 in a manner identical to the propagation of the light 110 along the illumination axis 112 (though in the opposite direction). It is noted that the first cleaning beam 124 may be configured to propagate along the illumination axis 112 in its entirety (e.g., until the first cleaning beam 124 reaches the first illumination source 102).

The second illumination source 122 may be configured to generate the first cleaning beam 124 such that the first cleaning beam 124 is a uniform irradiating illumination. In another embodiment, the second illumination source 122 may be configured to generate the first cleaning beam 124 such that the first cleaning beam 124 comprises one or more scanning rasters. The first cleaning beam 124 may be configured to illuminate a same field plane as the light 110 (e.g., as a result of the second illumination source 122 having a numerical aperture value equivalent to a numerical aperture value of the first illumination source 102).

In some embodiments, the optical system 100 may include a third illumination source 126 configured to generate a second cleaning beam 128. The third illumination source 126 may include, but is not limited to, any illumination source configured to generate EUV, VUV, DUV, and/or UV light. In this regard, the second cleaning beam 128 may include, but is not limited to, a EUV, VUV, DUV, and/or UV beam.

The third illumination source 126 may be configured to direct the second cleaning beam 128 to the imaging optics 108. For example, though not shown, the third illumination source 126 may be configured to direct the second cleaning beam 128 to one or more optical surfaces of the imaging optics 108 via one or more second cleaning optical elements. The third illumination source 126 (and, in some embodiments, one or more second cleaning optical elements) may be configured to direct the second cleaning beam 128 to a point in space corresponding to the mask surface 116. For example, as shown in FIG. 1B, when configured for cleaning, the optical system 100 may not include a sample 120. However, the third illumination source 126 (and, as applicable, one or more second cleaning optical elements) may configured to direct the second cleaning beam 128 to that point within the system 100 from which the imaging optics 106 may be configured to receive the light 110 from the sample 120. In this sense, the second cleaning beam 124 may be configured to propagate along the imaging axis 114 in a manner identical to the propagation of the light 110 along the imaging axis 114. It is noted that the second cleaning beam 128 may be configured to propagate along the imaging axis 114 in its entirety (e.g., until the second cleaning beam 128 reaches the detector 104).

The third illumination source 126 may be configured to generate the second cleaning beam 128 such that the second cleaning beam 128 is a uniform irradiating illumination. In another embodiment, the third illumination source 126 may be configured to generate the second cleaning beam 128 such that the second cleaning beam 128 comprises one or more scanning rasters. The second cleaning beam 128 may be configured to illuminate a same field plane as the light 110 (e.g., as a result of the third illumination source 126 having a numerical aperture value equivalent to a numerical aperture value of the first illumination source 102).

It is noted that each of the second illumination source 122 and the third illumination source 126 may be configured to direct illumination (e.g., the first cleaning beam 124 and/or the second cleaning beam 128, as the case may be) to the mask surface 116 via a common aperture (e.g., viewport) of the system 100.

It is specifically contemplated that the embodiments of the present disclosure are configured to provide cleaning light (e.g., the first cleaning beam 124 and/or the second cleaning beam 128) in such a manner that the cleaning light is confined only to the areas of optical surfaces that have been contaminated. For example, the embodiments of the present disclosure are configured such that the first cleaning beam 124 is configured to propagate along the illumination axis 112 in the same manner as the light 110. In this regard, the first cleaning beam 124 is naturally configured to interact with contaminants only on those areas that may be contaminated (e.g., via deposition catalyzed by the light 110 in inspection operation). Similarly, the second cleaning beam 128 is configured to propagate along the imaging axis 114 in the same manner as the light 110. In this regard, the second cleaning beam 128 is naturally configured to interact with contaminants only on those areas that may be contaminated (e.g., via deposition catalyzed by the light 110 in inspection operation). This approach reduces and/or eliminates the need for additional steering optics, apertures, or beam dumps within the optical system 100. Additionally, the need for shielding (e.g., to protect surrounding components from cleaning light) is alleviated. In this sense, irradiation of optical surfaces with cleaning light is also distributed in a manner equivalent to the distribution of the light 110 such that, in conditions in which the rate of contamination of carbonaceous compounds is proportional to the irradiance of the light 110, the risk of over- or under-cleaning optical surfaces is minimized.

Embodiments of the present disclosure are additionally configured to reduce the amount of cleaning light necessary to clean all optical surfaces of the system 100. For example, because cleaning light propagates along the entirety of each of the illumination axis 112 and the imaging axis 114, the cleaning light is reflected within and along each axis, allowing the cleaning light to be used to clean multiple optical surfaces (rather than being used to clean a single surface and then allowed to dissipate out of the optical system 100).

In some embodiments, the system 100 may include one or more chambers 118. The one or more chambers 118 may include, but are not limited to, one or more vacuum chambers. One or more elements of the system 100 may be disposed within the one or more chambers 118. For example, the first illumination source 103, the second illumination source 122, the first cleaning optical elements, the third illumination source 126, the second cleaning optical elements, the detector 104, the illumination optics 106, the imaging optics 108, the sample 120, and/or the stage 118 may be disposed within the one or more chambers 118. It is noted that the embodiments of the present disclosure are not limited to a single chamber 118. For example, though not shown, various elements of the system 100 may be disposed within a common chamber, while other elements of the system may be disposed within separate chambers 118. By way of another example, in some embodiments, certain elements of the present disclosure may not be disposed within a chamber 118.

Figure 2:
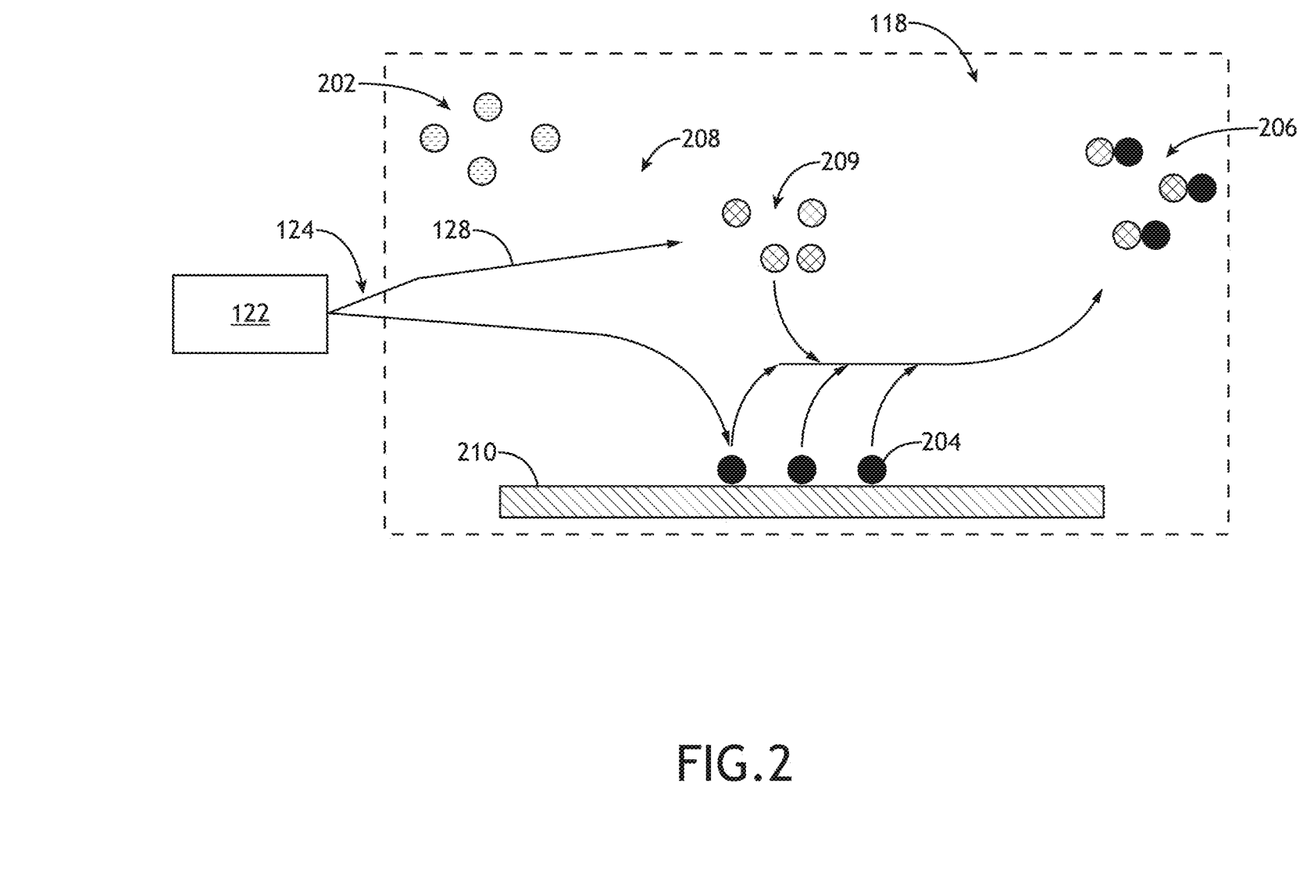
FIG. 2 depicts a method of cleaning an optical surface, in accordance with one or more embodiments of the present disclosure.

The one or more chambers may be configured to contain a selected purge gas 202 (as shown in FIG. 2). The selected purge gas (or at least a constituent of the purge gas) may undergo ionization or radicalization in the presence of the at least one of the first cleaning beam 128 or the second cleaning beam 124.

The selected purge gas 202 may include any purge gas known in the art to be suitable for cleaning one or more optical elements of the present disclosure. For example, the selected purge gas may include, but is not limited to, any gas comprising, in any proportion, ozone, oxygen, nitrogen, fluorine, hydrogen, or gaseous water. In one embodiment, the purge gas includes any gas known in the art that is ionizable by the first cleaning beam 124 and/or the second cleaning beam 128 (e.g., EUV light, VUV light, DUV light, UV light, or the like). In another embodiment, the purge gas may include a mixture of any one or more gases.

It is noted herein that the selected purge gas may be configured to cause or aid in the photodissociation of contaminants on the optical surfaces of the system 100. For example, the selected purge gas may be configured such that, upon photoreaction with at least one of the first cleaning beam 124 or the second cleaning beam 128, one or more ionic or free-radical species are formed, wherein the one or more free-radical species are configured to convert contaminants on the one or more optical surfaces to volatile (e.g., gaseous) reaction products that may be evacuated from the system 100.

FIG. 1C illustrates a block diagram view of an optical system 100, in accordance with one or more embodiments of the present disclosure. In some embodiments, the system 100 may include a controller 130 communicatively coupled to one or more other elements of the system 100 (e.g., the first illumination source 102, the detector 104, a pump 136, the second illumination source 122, and/or the third illumination source 126). The controller 130 may include one or more processors 132 communicatively coupled to one or more memory units 134. The one or more processors 132 may be configured to execute a set of program instructions stored in the one or more memory units 134 for acquiring inspection and/or measurement data from one or more components of the system 100 (e.g., the detector 104) and/or for controlling one or more portions of the system 100 (e.g., the first illumination source 102, the second illumination source 122, the third illumination source 126, the pump 136, or the like).

FIG. 2 depicts a method of cleaning an optical surface, in accordance with one or more embodiments of the present disclosure.

As previously described, contaminant buildups on optical surfaces may be removed by one or more photochemical reactions. For example, deposited carbonaceous buildups may be removed via one or more reactions with an ionic or free-radical species (e.g., oxygen (1D) and other excited states of oxygen, as well as excited states of nitrogen, fluorine, or the like). The ionic or free-radical species may be generated when a precursor gas (e.g., ozone) reacts with a photon of sufficient energy (e.g., a EUV, VUV, DUV, or UV photon). In this way, irradiation of an optical surface with illumination of sufficient energy in the presence of a precursor gas may cause the removal of contaminants built up on the optical surface.

The second illumination source 122 may be configured to generate the first cleaning beam 124 and direct the first cleaning beam 124 into one or more chambers 118 of the system 100. It is noted, that for purposes of FIG. 2, the embodiments of the present disclosure are not limited to the conceptual illustration included therein. For example, it is specifically contemplated that embodiments of the present disclosure shown in FIG. 2 may include the illumination and propagation of the first cleaning beam 124 as shown in and described by reference to FIG. 1B (e.g., propagation via cleaning optical elements to the mask surface 116, propagation along the illumination axis, etc.).

The one or more chambers 118 may include the selected purge gas 202. Upon irradiation of the one or more chambers 118, the selected purge gas 202 may undergo one or more photochemical reactions 208 in which the first cleaning beam 124 may cause excitation of one or more components of the selected purge gas 202 such that one or more ionic species or free-radicals 209 are generated.

The one or more ionic species or free-radicals 209 generated by the photochemical reaction between the first cleaning beam 124 and one or more components of the selected purge gas 202 may be capable of converting, via one or more chemical reactions, one or more contaminants 204 present on an optical surface 210 of the system 100. For example, the one or more components of the selected purge gas 202 may react with the one or more contaminants to form a volatile reaction product 206 that, in the one or more chambers 118, exists in a gaseous state.

It is noted that the one or more optical surfaces 210 of the system may include any portion of any optical element of the system 100. For example, the one or more optical surfaces 210 may include, but are not limited to, any portion of the first illumination source 103, the second illumination source 122, the first cleaning optical elements, the third illumination source 126, the second cleaning optical elements, the detector 104, the illumination optics 106, and/or the imaging optics 108.

The reaction product 206 may be evacuated from the one or more chambers 118. For example, upon completion of the cleaning process, the system 100 may cause one or more pumps 136 to remove the reaction product 206 from the one or more chambers 118.

The one or more pumps 136 may include any pump known in the art to be suitable for removing the gaseous reaction product(s) formed from the interaction of the ionic and/or radicalized species 209 of the purge gas 202 and the one or more contaminants 204. For example, the one or more pumps 136 may include, but is not limited to, one or more vacuum pumps.

In another embodiment, the one or more pumps 136 may include a pump system suitable for establishing and maintaining a low-pressure or vacuum environment within the one or more chambers 118. For example, the one or more pumps 136 may include a turbo pump and/or a roots pump backed with a dry pumping unit and equipped with an exhaust system (not shown).

It is noted that, for purposes of FIG. 2, only the second illumination source 122 has been shown. However, embodiments of the present disclosure are not limited to the second illumination source 122. For example, it is specifically contemplated that the cleaning processes and the attendant photochemical reactions disclosed herein may be performed using any one of, or any combination of, the second illumination source 122 and/or the third illumination source 126.

Figure 3:
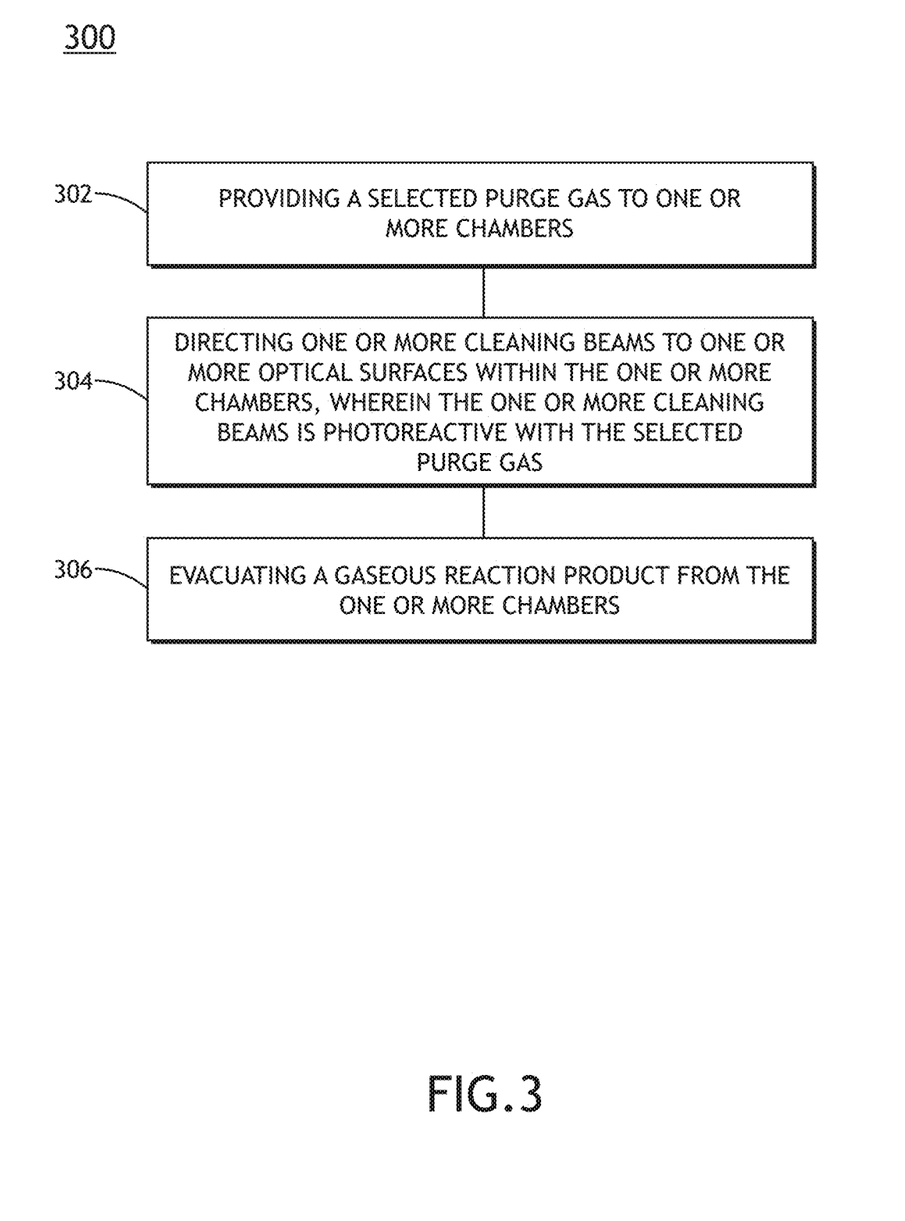
FIG. 3 depicts a flowchart illustrating the steps of a method of cleaning an optical surface, in accordance with one or more embodiments of the present disclosure.

FIG. 3 depicts a flowchart illustrating the steps of a method of cleaning an optical surface, in accordance with one or more embodiments of the present disclosure.

In Step 302, a selected purge gas is provided to one or more chambers. For example, the selected purge gas 202 may be provided to the one or more chambers 118. The selected purge gas 202 may include any purge gas known in the art to be suitable for cleaning one or more optical elements of the present disclosure. For example, the selected purge gas may include, but is not limited to, any gas comprising, in any proportion, ozone, oxygen, nitrogen, fluorine, hydrogen, or gaseous water. In one embodiment, the purge gas includes any gas known in the art that is ionizable by the first cleaning beam 124 and/or the second cleaning beam 128 (e.g., EUV light, VUV light, DUV light, UV light, or the like). In another embodiment, the purge gas may include a mixture of any one or more gases.

In Step 304, one or more cleaning beams are directed to one or more optical surfaces within the one or more chambers, wherein the one or more cleaning beams is photoreactive with the selected purge gas. For example, the second illumination source 122 and/or the third illumination source 126 may direct the first cleaning beam 124 or the second cleaning beam 128, as the case may be, at one or more components of the optical system 100. By way of another example, the second illumination source 122 may direct the first cleaning beam 124 along the illumination axis 112. By way of yet another example, the third illumination source 126 may direct the second cleaning beam 128 along the imaging axis 114.

Upon direction of the one or more cleaning beams to one or more optical surfaces of the system 100, the selected purge gas 202 may undergo one or more photochemical reactions 208 in which the first cleaning beam 124 and/or the second cleaning beam 128 may cause excitation of one or more components of the selected purge gas 202 such that the one or more ionic species or free-radicals 209 are generated. The one or more ionic species or free-radicals 209 generated by the photochemical reaction between the first cleaning beam 124 and one or more components of the selected purge gas 202 may convert the one or more contaminants 204 present on an optical surface 210 of the system 100. For example, the one or more components of the selected purge gas 202 may react with the one or more contaminants to form a volatile reaction product 206 that, in the one or more chambers 118, exists in a gaseous state.

In Step 306, the gaseous reaction product is evacuated from the one or more chambers. For example, the reaction product 206 may be evacuated from the one or more chambers 118. For example, upon completion of the cleaning process, the system 100 may cause one or more pumps 136 to remove the reaction product 206 from the one or more chambers 118 (e.g., via the controller 130).

It is noted that the scope of the present disclosure is not limited to the optical system 100. Rather, the system incorporating the various aspects of the present disclosure may include any other optical system known in the art, including a characterization system, a metrology system, and/or a lithography system.

For example, in one embodiment, the optical system 100 is configured as a wafer inspection system or a reticle inspection system. In this regard, the optical system 100 may include any wafer or reticle inspection optical architecture known in the art suitable for operating in the EUV and/or VUV spectral range. It is further recognized that the optical system 100 may be configured as EUV mask blank inspection system. EUV-based mask blank inspection is described generally in U.S. Pat. No. 8,711,346 to Stokowski, issued on Apr. 29, 2014, which is incorporated herein by reference in the entirety. EUV-based mask blank inspection is described generally in U.S. patent application Ser. No. 13/417,982 to Xiong et al., filed on Mar. 12, 2012, which is incorporated herein by reference in the entirety. EUV-based reticle inspection is generally described in U.S. patent application Ser. No. 13/905,449 to Nasser-Ghodsi et al., filed on May 30, 2013, which is incorporated herein by reference in the entirety.

By way of another example, in another embodiment, although not shown, the optical system 100 may be configured as an EUV lithography system. In one embodiment, the optical lithography system (not shown) may include a set of illuminator optics configured to direct output light from the light source 100 to an EUV-compatible lithography mask (e.g., EUV reflective mask). In another embodiment, the lithography system includes a set of projection optics configured to receive illumination reflected from the mask and direct the reflected illumination from the mask to one or more wafers disposed on a wafer stage. The optical lithography system may include any EUV lithography system known in the art. EUV-based lithography is described generally in U.S. patent application Ser. No. 13/419,042 to Wang, filed on Mar. 13, 2012, which is incorporated herein by reference in the entirety.

It is contemplated herein that the various embodiment of the present invention may be implemented conjunctively or independently. For example, the embodiments depicted in FIG. 1A through FIG. 2 should be interpreted to be applicable in conjunction with one another.

The one or more processors 132 of a controller 130 may include any processor or processing element known in the art. For the purposes of the present disclosure, the term "processor" or "processing element" may be broadly defined to encompass any device having one or more processing or logic elements (e.g., one or more micro-processor devices, one or more application specific integrated circuit (ASIC) devices, one or more field programmable gate arrays (FPGAs), or one or more digital signal processors (DSPs)). In this sense, the one or more processors 132 may include any device configured to execute algorithms and/or instructions (e.g., program instructions stored in memory). In one embodiment, the one or more processors 132 may be embodied as a desktop computer, mainframe computer system, workstation, image computer, parallel processor, networked computer, or any other computer system configured to execute a program configured to operate or operate in conjunction with the metrology system 100, as described throughout the present disclosure Moreover, different subsystems of the system 100, such as the devices 102, 104, 122, 126, and 136 may include a processor or logic elements suitable for carrying out at least a portion of the steps described in the present disclosure. Therefore, the above description should not be interpreted as a limitation on the embodiments of the present disclosure but merely as an illustration. Further, the steps described throughout the present disclosure may be carried out by a single controller 130 or, alternatively, multiple controllers. Additionally, the controller 130 may include one or more controllers housed in a common housing or within multiple housings. In this way, any controller or combination of controllers may be separately packaged as a module suitable for integration into metrology system 100. Further, the controller 130 may analyze data received from the detector 104 and feed the data to additional components within the system 100 or external to the system 100.

The memory 134 may include any storage medium known in the art suitable for storing program instructions executable by the associated one or more processors 132. For example, the memory 134 may include a non-transitory memory medium. By way of another example, the memory 134 may include, but is not limited to, a read-only memory (ROM), a random-access memory (RAM), a magnetic or optical memory device (e.g., disk), a magnetic tape, a solid-state drive and the like. It is further noted that memory 134 may be housed in a common controller housing with the one or more processors 132. In one embodiment, the memory 134 may be located remotely with respect to the physical location of the one or more processors 132 and controller 130. For instance, the one or more processors 132 of controller 130 may access a remote memory (e.g., server), accessible through a network (e.g., internet, intranet and the like).

In one embodiment, though not shown, a user interface 135 may be communicatively coupled to the controller 130. In one embodiment, the user interface 135 may include, but is not limited to, one or more desktops, laptops, tablets, and the like. In another embodiment, the user interface 135 includes a display used to display data of the system 100 to a user. The display of the user interface 135 may include any display known in the art. For example, the display may include, but is not limited to, a liquid crystal display (LCD), an organic light-emitting diode (OLED) based display, or a CRT display. Those skilled in the art should recognize that any display device capable of integration with a user interface 135 is suitable for implementation in the present disclosure. In another embodiment, a user may input selections and/or instructions responsive to data displayed to the user via a user input device of the user interface 135.

In another embodiment, the controller 130 is communicatively coupled to one or more elements of the system 100. In this regard, the controller 130 may transmit and/or receive data from any component of the system 100. Further, the controller 130 may direct or otherwise control any component of the system 100 by generating one or more control signals for the associated components. For example, the controller 130 may be communicatively coupled to the detector 104 to receive one or more images from the detector 104.

All of the methods described herein may include storing results of one or more steps of the method embodiments in memory 134. The results may include any of the results described herein and may be stored in any manner known in the art. The memory may include any memory described herein or any other suitable storage medium known in the art. After the results have been stored, the results can be accessed in the memory and used by any of the method or system embodiments described herein, formatted for display to a user, used by another software module, method, or system, and the like. Furthermore, the results may be stored "permanently," "semi-permanently," temporarily," or for some period of time. For example, the memory may be random access memory (RAM), and the results may not necessarily persist indefinitely in the memory.

It is further contemplated that each of the embodiments of the method described above may include any other step(s) of any other method(s) described herein. In addition, each of the embodiments of the method described above may be performed by any of the systems described herein.

One skilled in the art will recognize that the herein described components operations, devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components, operations, devices, and objects should not be taken as limiting.

As used herein, directional terms such as "top," "bottom," "over," "under," "upper," "upward," "lower," "down," and "downward" are intended to provide relative positions for purposes of description, and are not intended to designate an absolute frame of reference. Various modifications to the described embodiments will be apparent to those with skill in the art, and the general principles defined herein may be applied to other embodiments.

With respect to the use herein of any plural and/or singular terms, those having skill in the art can translate from the plural to the singular and/or from the singular to the plural as is appropriate to the context and/or application. The various singular/plural permutations are not necessarily expressly set forth herein for sake of clarity.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected", or "coupled", to each other to achieve the desired functionality, and any two components capable of being so associated can also be viewed as being "couplable", to each other to achieve the desired functionality. Specific examples of couplable include but are not limited to physically mateable and/or physically interacting components and/or wirelessly interactable and/or wirelessly interacting components and/or logically interacting and/or logically interactable components.

Furthermore, it is to be understood that the invention disclosed and described herein is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," and the like). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an"

limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, and the like" is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, and the like). In those instances where a convention analogous to "at least one of A, B, or C, and the like" is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, and the like). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed is:

1. An optical system comprising:
   a first illumination source configured to generate light;
   a detector;
   a set of illumination optics configured to receive at least a portion of the light from the first illumination source and direct at least a portion of the light to one or more sample surfaces of one or more samples along an illumination axis;
   a set of imaging optics configured to receive at least a portion of the light from the one or more sample surfaces and direct the at least a portion of the light from the one or more sample surfaces to the detector along an imaging axis;
   a second illumination source configured to generate a first cleaning beam and direct at least a portion of the first cleaning beam to the set of illumination optics via at least one of the illumination axis or the imaging axis;
   a third illumination source configured to generate a second cleaning beam and direct at least a portion of the second cleaning beam to at least one of the set of imaging optics or the detector via at least one of the illumination axis or the imaging axis, wherein each of the second illumination source and the third illumination source has a numerical aperture value equivalent to a numerical aperture value of the first illumination source; and
   one or more chambers, wherein the set of illumination optics, the set of imaging optics, and the detector are disposed within the one or more chambers, wherein each of the one or more chambers is configured to contain a selected purge gas, wherein the selected purge gas is photoreactive with at least one of the first cleaning beam or the second cleaning beam, and wherein photoreaction of the selected purge gas with at least one of the first cleaning beam or the second cleaning beam forms at least one of one or more ionic species or one or more free-radical species, and wherein the at least one of one or more ionic species or one or more free-radical species is capable of converting to one or more volatile species contaminants from one or more optical surfaces of at least one of the set of illumination optics, the set of imaging optics, or the detector.

2. The optical system of claim 1, wherein the optical system is configured as a mask inspection system.

3. The optical system of claim 2, wherein the first illumination source comprises a broadband illumination source.

4. The optical system of claim 3, wherein the first illumination source comprises an illumination source configured to generate at least one of extreme ultraviolet light, vacuum ultraviolet light, deep ultraviolet light, or ultraviolet light.

5. The optical system of claim 2, wherein the first illumination source comprises a narrowband illumination source.

6. The optical system of claim 1, wherein each of the first cleaning beam and the second cleaning beam is configured to illuminate a same field plane as the light.

7. The optical system of claim 6, wherein each of the first cleaning beam and the second cleaning beam comprises at least one of uniform illumination or one or more scanning rasters.

8. The optical system of claim 1, wherein each of the second illumination source and the third illumination source is configured to generate at least ultraviolet light.

9. The optical system of claim 1, wherein the first cleaning beam comprises ultraviolet light having a wavelength of between approximately 210 nanometers and approximately 300 nanometers.

10. The optical system of claim 1, wherein the second cleaning beam comprises ultraviolet light having a wavelength of between approximately 210 nanometers and approximately 300 nanometers.

11. The optical system of claim 1, wherein the selected purge gas comprises at least one of ozone, fluorine, or nitrogen.

12. The optical system of claim 11, wherein the one or more ionic species comprise one or more ions of at least one of oxygen, nitrogen, or fluorine.

13. The optical system of claim 12, wherein the one or more ions are configured to remove one or more elements of the contaminants from at least one of a set of illumination optics, the set of imaging optics, or the detector via one or more photoreactions between the contaminants and at least one of the first cleaning beam or the second cleaning beam, wherein the one or more photoreactions forms a gaseous reaction product within the one or more chambers.

14. The optical system of claim 13, further comprising one or more pumps configured to evacuate the gaseous reaction product from the one or more chambers.

15. The optical system of claim 11, wherein the one or more free-radical species comprise one or more free radicals of at least one of oxygen, nitrogen, or fluorine.

16. The optical system of claim 15, wherein the one or more free radicals are configured to remove one or more elements of the contaminants from at least one of a set of illumination optics, the set of imaging optics, or the detector via one or more photoreactions between the contaminants and at least one of the first cleaning beam or the second cleaning beam, wherein the one or more photoreactions forms a gaseous reaction product within the one or more chambers.

17. The optical system of claim 16, further comprising one or more pumps configured to evacuate the gaseous reaction product from the one or more chambers.

18. The optical system of claim 1, wherein the selected purge gas comprises a mixture of two or more gases.

19. The optical system of claim 1, wherein the first illumination source comprises a laser source configured to generate illumination having a wavelength of at least one of approximately 355 nanometers, approximately 266 nanometers, or approximately 193 nanometers.

20. An optical system comprising:
a first illumination source configured to generate light;
a detector;
a set of illumination optics configured to receive at least a portion of the light from the first illumination source and direct at least a portion of the light to one or more sample surfaces of one or more samples along an illumination axis;
a set of imaging optics configured to receive at least a portion of the light from the one or more sample surfaces and direct the at least a portion of the light from the one or more sample surfaces to the detector along an imaging axis;
a second illumination source configured to generate a first cleaning beam and direct at least a portion of the first cleaning beam to the set of illumination optics via at least one of the illumination axis or the imaging axis;
a third illumination source configured to generate a second cleaning beam and direct at least a portion of the second cleaning beam to at least one of the set of imaging optics or the detector via at least one of the illumination axis or the imaging axis, wherein each of the second illumination source and the third illumination source has a numerical aperture value equivalent to a numerical aperture value of the first illumination source; and
one or more chambers, wherein the set of illumination optics, the set of imaging optics, and the detector are disposed within the one or more chambers, wherein each of the one or more chambers is configured to contain a selected purge gas, wherein the selected purge gas is photoreactive with the first cleaning beam, and wherein photoreaction of the selected purge gas with the first cleaning beam forms at least one of one or more ionic species or one or more free-radical species, and wherein the at least one of one or more ionic species or one or more free-radical species is capable of converting to one or more volatile species contaminants from one or more optical surfaces of at least one of the set of illumination optics, the set of imaging optics, or the detector.

21. The optical system of claim 20, wherein the optical system is configured as a mask inspection system.

22. The optical system of claim 21, wherein each of the first cleaning beam and the second cleaning beam comprises at least one of uniform illumination or one or more scanning rasters.

23. The optical system of claim 21, wherein the first illumination source comprises a broadband illumination source.

24. The optical system of claim 23, wherein the first illumination source comprises an illumination source configured to generate at least one of extreme ultraviolet light, vacuum ultraviolet light, deep ultraviolet light, or ultraviolet light.

25. The optical system of claim 21, wherein the first illumination source comprises a narrowband illumination source.

26. The optical system of claim 21, wherein each of the second illumination source and the third illumination source is configured to generate at least ultraviolet light.

27. The optical system of claim 21, wherein the first cleaning beam comprises ultraviolet light having a wavelength of between approximately 210 nanometers and approximately 300 nanometers.

28. The optical system of claim 21, wherein the second cleaning beam comprises ultraviolet light having a wavelength of between approximately 210 nanometers and approximately 300 nanometers.

29. The optical system of claim 21, wherein the selected purge gas comprises at least one of ozone, fluorine, or nitrogen.

30. The optical system of claim 21, wherein the one or more ionic species comprise one or more ions of at least one of oxygen, nitrogen, or fluorine.

31. The optical system of claim 30, wherein the one or more ions are configured to remove one or more elements of the contaminants from at least one of a set of illumination optics, the set of imaging optics, or the detector via one or more photoreactions between the contaminants and at least one of the first cleaning beam or the second cleaning beam, wherein the one or more photoreactions forms a gaseous reaction product within the one or more chambers.

32. The optical system of claim 31, further comprising one or more pumps configured to evacuate the gaseous reaction product from the one or more chambers.

33. The optical system of claim 21, wherein the one or more free-radical species comprise one or more free radicals of at least one of oxygen, nitrogen, or fluorine.

34. The optical system of claim 33, wherein the one or more free radicals are configured to remove one or more elements of the contaminants from at least one of a set of illumination optics, the set of imaging optics, or the detector via one or more photoreactions between the contaminants and at least one of the first cleaning beam or the second cleaning beam, wherein the one or more photoreactions forms a gaseous reaction product within the one or more chambers.

35. The optical system of claim 34, further comprising one or more pumps configured to evacuate the gaseous reaction product from the one or more chambers.

36. The optical system of claim 21, wherein the selected purge gas comprises a mixture of two or more gases.

37. The optical system of claim 20, wherein each of the first cleaning beam and the second cleaning beam is configured to illuminate a same field plane as the light.

38. The optical system of claim 20, wherein the first illumination source comprises a laser source configured to generate illumination having a wavelength of at least one of approximately 355 nanometers, approximately 266 nanometers, or approximately 193 nanometers.

39. A method of cleaning optical surfaces, comprising:
generating one or more laser beams;
imaging one or more sample surface with the one or more laser beams;
providing a selected purge gas to one or more chambers;
directing one or more cleaning beams to one or more optical surfaces within the one or more chambers, wherein each of the one or more cleaning beams is photoreactive with the selected purge gas, and wherein photoreaction of the selected purge gas with the one or more cleaning beams forms at least one of one or more ionic species or one or more free-radical species, and wherein the at least one of one or more ionic species or one or more free-radical species is capable of converting, to one or more volatile species, contaminants from one or more optical surfaces to form a gaseous reaction product, wherein the one or more cleaning beams has a numerical aperture value equivalent to a numerical aperture value of the one or more laser beams; and
evacuating the gaseous reaction product from the one or more chambers.

40. The method of claim 39, wherein the generating one or more laser beams comprises:
generating one or more laser beams having a wavelength of at least one of approximately 355 nanometers, approximately 266 nanometers, or approximately 193 nanometers.

* * * * *